United States Patent
Yang et al.

(10) Patent No.: US 8,809,848 B1
(45) Date of Patent: Aug. 19, 2014

(54) FULL-BAND AND HIGH-CRI ORGANIC LIGHT-EMITTING DIODE

(71) Applicant: National Tsing Hua University, Hsinchu (TW)

(72) Inventors: Fu-Chin Yang, Hsinchu (TW); Jwo-Huei Jou, Hsinchu (TW); Chun-Ju Tseng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 14 days.

(21) Appl. No.: 13/869,944

(22) Filed: Apr. 24, 2013

(30) Foreign Application Priority Data

Mar. 7, 2013 (TW) .............................. 102108026 U

(51) Int. Cl.
*H01L 51/54* (2006.01)
*H01L 51/56* (2006.01)
*H01L 51/52* (2006.01)
*H01L 51/00* (2006.01)

(52) U.S. Cl.
CPC ............ *H01L 51/52* (2013.01); *H01L 51/0067* (2013.01); *H01L 51/0074* (2013.01); *H01L 51/0072* (2013.01)
USPC ............ 257/40; 257/72; 257/88; 257/E33.06; 257/E51.018; 257/E51.022; 257/E51.043; 438/22; 438/46

(58) Field of Classification Search
CPC ............ H01L 51/0067; H01L 51/0072; H01L 51/0074
USPC .................. 257/40, 72, 88, E33.06, E51.018, 257/E51.022, E51.043; 438/22, 46
See application file for complete search history.

(56) References Cited

U.S. PATENT DOCUMENTS

| 2007/0007538 | A1* | 1/2007 | Ono et al. ........................ 257/79 |
| 2010/0051998 | A1* | 3/2010 | Jou .................................. 257/98 |
| 2011/0177641 | A1* | 7/2011 | Cheon et al. ..................... 438/46 |
| 2011/0260141 | A1* | 10/2011 | Lecloux et al. .................. 257/40 |
| 2011/0266525 | A1* | 11/2011 | Lecloux et al. .................. 257/40 |
| 2012/0001204 | A1* | 1/2012 | Jagt .................................. 257/88 |

* cited by examiner

*Primary Examiner* — Dao H Nguyen

(57) ABSTRACT

The present invention relates to a full-band and high-CRI organic light-emitting diode, comprising: a first conductive layer, at least one first carrier transition layer, a plurality of light-emitting layers, at least one second carrier transition layer, and a second conductive layer. In the present invention, a plurality of dyes are doped in the light-emitting layers, so as to make the light-emitting layers emit a plurality of blackbody radiation complementary lights, wherein the chromaticity coordinates of the blackbody radiation complementary lights surround to a specific area on 1931 CIE (Commission International de'Eclairage) Chromaticity Diagram, moreover, the specific area fully encloses the Planck's locus on 1931 CIE Chromaticity Diagram, such that the blackbody radiation complementary lights mix to each other and then become a full-band and high-CRI light.

10 Claims, 10 Drawing Sheets

| first light-emitting layer | second light-emitting layer | | | third light-emitting layer | | |
|---|---|---|---|---|---|---|
| (Wt%) | orange-red dye (Wt%) | yellow dye (Wt%) | green dye (Wt%) | sky-blue dye (Wt%) | deep-red dye (Wt%) | CRI: 92.2 |
| 0.2 | 0.17 | 0.24 | 0.42 | 0.18 | 0.41 | CT: 3639 K |

FIG. 4

| first light-emitting layer | second light-emitting layer | | | third light-emitting layer | | CRI: 90.4 |
|---|---|---|---|---|---|---|
| (Wt%) | orange-red dye (Wt%) | yellow dye (Wt%) | green dye (Wt%) | sky-blue dye (Wt%) | deep-red dye (Wt%) | CT: 3546 K |
| 0.32 | 0.24 | 0.2 | 0.6 | 0 | 0.47 | |

FULL-BAND AND HIGH-CRI ORGANIC LIGHT-EMITTING DIODE

BACKGROUND OF THE INVENTION

1. Field of the Invention

The present invention relates to an organic light-emitting diode (OLED), and more particularly to a full-band and high-CRI organic light-emitting diode.

2. Description of the Prior Art

An organic light emitting diode (OLED) was invented by C. W. Tang and S. A. VanSlyk et al. of Eastman Kodak Company in 1987 and manufactured by a vacuum evaporation method. A hole transporting material and an electron transporting material (such as $Alq_3$) are respectively deposited on a transparent indium tin oxide (abbreviated as ITO) glass, and then a metal electrode is vapor-deposited thereon to form the self-luminescent OLED apparatus. Due to high brightness, fast response speed, light weight, compactness, true color, no difference in viewing angles, no need of liquid crystal display (LCD) type backlight plates as well as a saving in light sources and low power consumption, it has become a new generation display.

In addition to light-emitting layers, the conventional OLED device is often added to other intermediate layers, such as an electron transport layer and a hole transport layer, so as to enhance the efficiency of the OLED device. Referring to FIG. 1, which is a structural drawing of a conventional OLED device. As shown in FIG. 1, the conventional OLED device 1' includes a cathode 11', an electron injection layer 12', an electron transport layer 13', a first light-emitting layer 14', a second light-emitting layer 15', a hole transport layer 16', a hole injection layer 17', and an anode 18'.

The above-mentioned conventional OLED device 1' is a high efficiency OLED device; however, it is a white light OLED device and performs a poor color rendering index (CRI). For above reasons, the OLED device 1' is unsuitable for being a long-term used light source.

Accordingly, in view of the conventional OLED devices still have shortcomings and drawbacks, the inventor of the present application has made great efforts to make inventive research thereon and eventually provided a full-band and high-CRI organic light-emitting diode.

SUMMARY OF THE INVENTION

The primary objective of the present invention is to provide a full-band and high-CRI organic light-emitting diode, in which the full-band and high-CRI organic light-emitting diode comprises a first conductive layer, at least one first carrier transition layer, a plurality of light-emitting layers, at least one second carrier transition layer, and a second conductive layer, and particularly a plurality of a plurality of dyes are doped in the light-emitting layers for making the light-emitting layers emit a plurality of blackbody radiation complementary lights. Therefore, the chromaticity coordinates of the blackbody radiation complementary lights surround to a specific area on 1931 CIE (Commission International de'Eclairage)Chromaticity Diagram, moreover, the specific area fully encloses the Planck's locus on 1931 CIE Chromaticity Diagram, such that the blackbody radiation complementary lights mix to each other and then become a full-band and high-CRI light.

Accordingly, to achieve the primary objective of the present invention, the inventor of the present invention provides a full-band and high-CRI organic light-emitting diode, comprising: a first conductive layer; at least one first carrier transition layer, being formed on the first conductive layer; a plurality of light-emitting layers, being formed on the first carrier transition layer; at least one second carrier transition layer, being formed on the light-emitting layer; and a second conductive layer, being formed on the second carrier transition layer. Wherein a plurality of dyes are doped in the light-emitting layers, so as to make the light-emitting layers emit a plurality of blackbody radiation complementary lights, therefore the blackbody radiation complementary lights mix to each other and then become a full-band and high-CRI light.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 4 is a related composition material table of the full-band and high-CRI organic light-emitting diode;

FIG. 7 is a composition material table of the second experimental framework for the full-band and high-CRI organic light-emitting diode;

DETAILED DESCRIPTION OF THE PREFERRED EMBODIMENTS

To more clearly describe a full-band and high-CRI organic light-emitting diode according to the present invention, embodiments of the present invention will be described in detail with reference to the attached drawings hereinafter.

Figure 1:
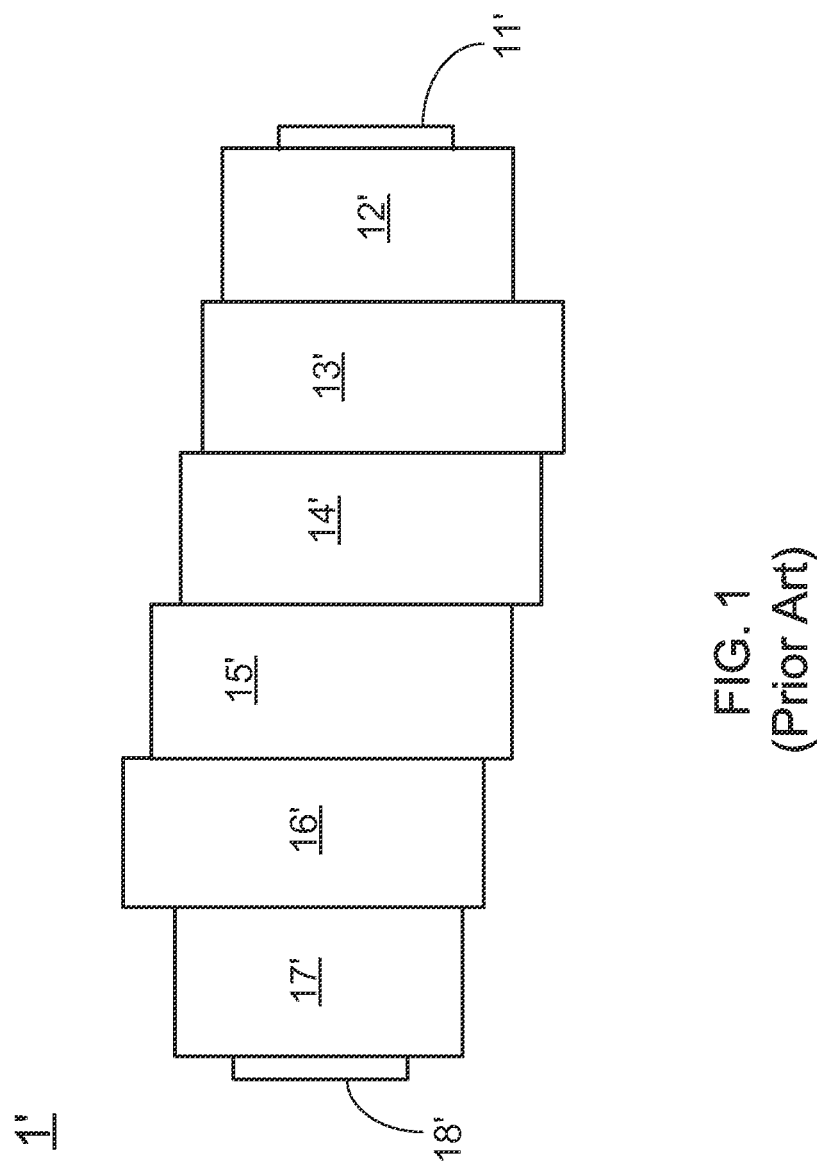
FIG. 1 is a structural drawing of a conventional OLED device.
Figure 2:
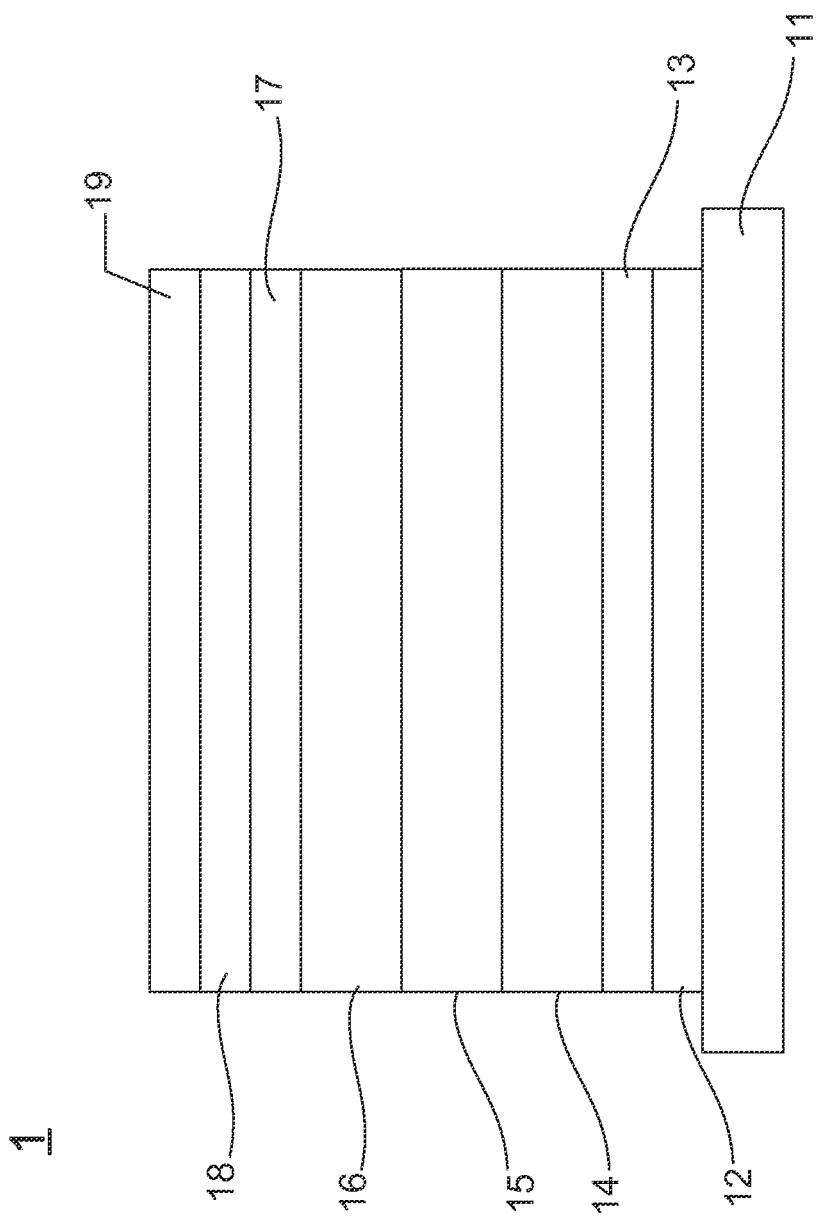
FIG. 2 is a framework view of a full-band and high-CRI organic light-emitting diode according to the present invention.

Please refer to FIG. 2, which illustrates a framework view of a full-band and high-CRI organic light-emitting diode according to the present invention. As shown in FIG. 2, the a full-band and high-CRI organic light-emitting diode 1 includes: a first conductive layer 11, at least one first carrier transition layer, a plurality of light-emitting layers, at least one second carrier transition layer, and a second conductive layer 19, wherein the first conductive layer 11 is an anode and the second conductive layer 19 is a cathode.

In some exemplary embodiments, as shown in FIG. 2, the first carrier transition layer is formed on the first conductive layer 11 and consists of a hole-injecting layer 12 and a hole-transporting layer 13. The light-emitting layers are formed on the hole-transporting layer 13 and includes a first light-emitting layer 14, a second light-emitting layer 15 and a third light-emitting layer 16. Opposite to the first carrier transition layer, the second carrier transition layer is formed on the third light-emitting layer 16 and consists of an electron-transporting layer 17 and an electron-injecting layer 18. Furthermore, the second conductive layer 19 is formed on the electron-injecting layer 18.

It needs to further explain that, although the full-band and high-CRI organic light-emitting diode 1 shown in FIG. 2 uses the hole-injecting layer 12 and the hole-transporting layer 13 as the first carrier transition layer, the hole-injecting layer 12 and the hole-transporting layer 13 does not the limited embodiment for the first carrier transition layer. In others exemplary embodiment, the first carrier transition layer can also be a single layer of hole injection or a single layer of hole transportation. Similarly, the electron-injecting layer 18 and the electron-transporting layer 17 does not the limited embodiment for the second carrier transition layer; the first carrier transition layer can also be a single layer of electron injection or a single layer of electron transportation. Moreover, the number of the light-emitting layers does not be limited to "3". Particularly, in the present invention, a plurality of dyes are doped in the light-emitting layers (14, 15, 16) for making the light-emitting layers emit a plurality of blackbody radiation complementary lights, therefore the blackbody radiation complementary lights mix to each other and then become a full-band and high-CRI light.

Figure 3:
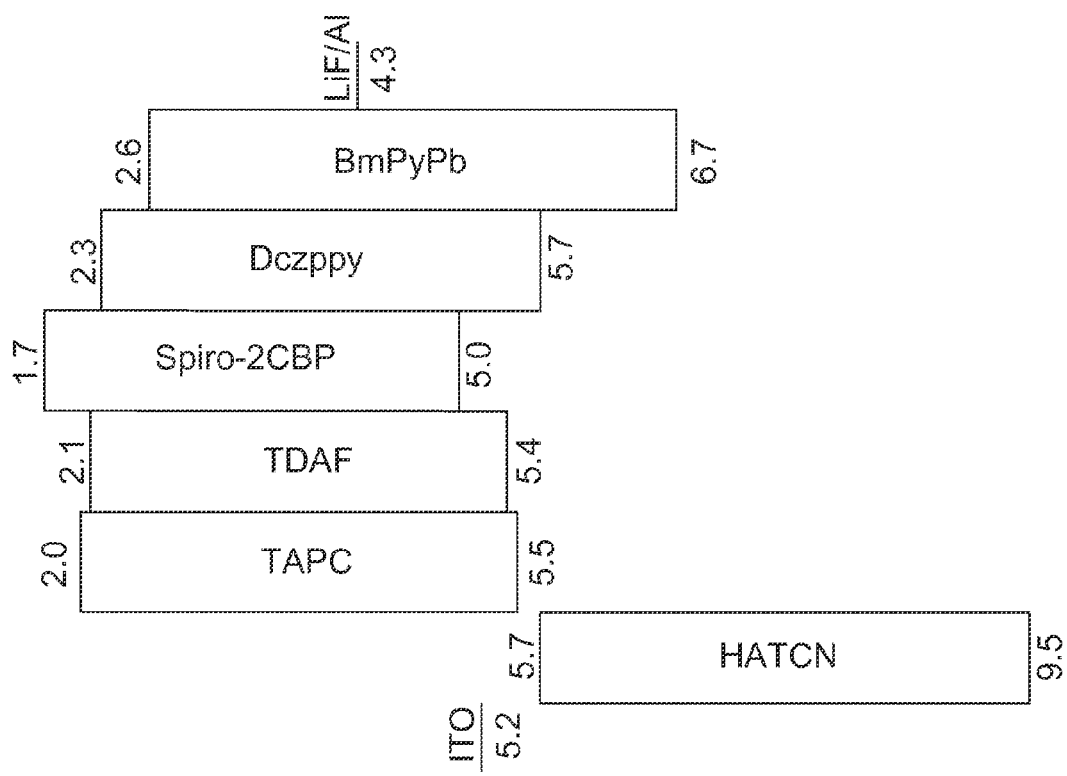
FIG. 3 is a first experimental framework of the full-band and high-CRI organic light-emitting diode.

For further introducing the framework and technology feature of the full-band and high-CRI organic light-emitting diode 1, various experiment data will be presented in following paragraphs. Referring to FIG. 2 again, and please simultaneously refer to FIG. 3 and FIG. 4, there are shown a first experimental framework and the related composition material table of the full-band and high-CRI organic light-emitting diode. As shown in FIG. 3, the first experimental framework uses ITO (indium tin oxide) as the anode (i.e. the first conductive layer 11) of the full-band and high-CRI organic light-emitting diode 1; moreover, the first experimental framework uses HATCN (Hexaazatriphenylene-hexacabonitrile), TAPC (1,1-Bis[4-[N,N'-di(p-tolyl)amino]phenyl]cyclohexane), TDAF (2,7-Bis[9,9-di(4-Methylphenyl)-fluoren-2-yl]-9,9-di (4-M), Spiro-2CBP (2,7-Bis(9-carbazolyl)-9,9-sspirobifluorene), Dczppy (2,6-bis[3'-(N-carbazole)phenyl]pyridine), BmPyPb (1,3-bis(3,5-dipyrid-3-yl-phenyl)benzene), LiF (lithium fluoride), Al (aluminum) as the hole-injecting layer 12, the hole-transporting layer 13, the first light-emitting layer 14, the second light-emitting layer 15, the third light-emitting layer 16, the electron-transporting layer 17, the electron-injecting layer 18, and the second conductive layer 19 (i.e., cathode), respectively.

In the first experimental framework, as shown in FIG. 4, the weight percentage (wt %) of the first light-emitting layer 14 is 0.2, and the first conductive layer 14 is able to emit a blackbody radiation complementary light with the color of deep-blue. The second light-emitting layer 15 is doped with an orange-red dye, a yellow dye and a green dye, wherein the weight percentages (wt %) of the orange-red dye, the yellow dye and the green dye are 0.17, 0.24 and 0.42, respectively, such that the second light-emitting layer 15 can emit a blackbody radiation complementary light with the color of orange-red, a blackbody radiation complementary light with the color of yellow, and a blackbody radiation complementary light with the color of green. Besides, the third light-emitting layer 16 is doped with a sky-blue dye and a deep-red dye, wherein the weight percentages (wt %) of the sky-blue dye and the deep-red dye are 0.18 and 0.41, respectively; so that, the third light-emitting layer 16 may emit a blackbody radiation complementary light with the color of sky-blue and a blackbody radiation complementary light with the color of deep-red.

Figure 5:
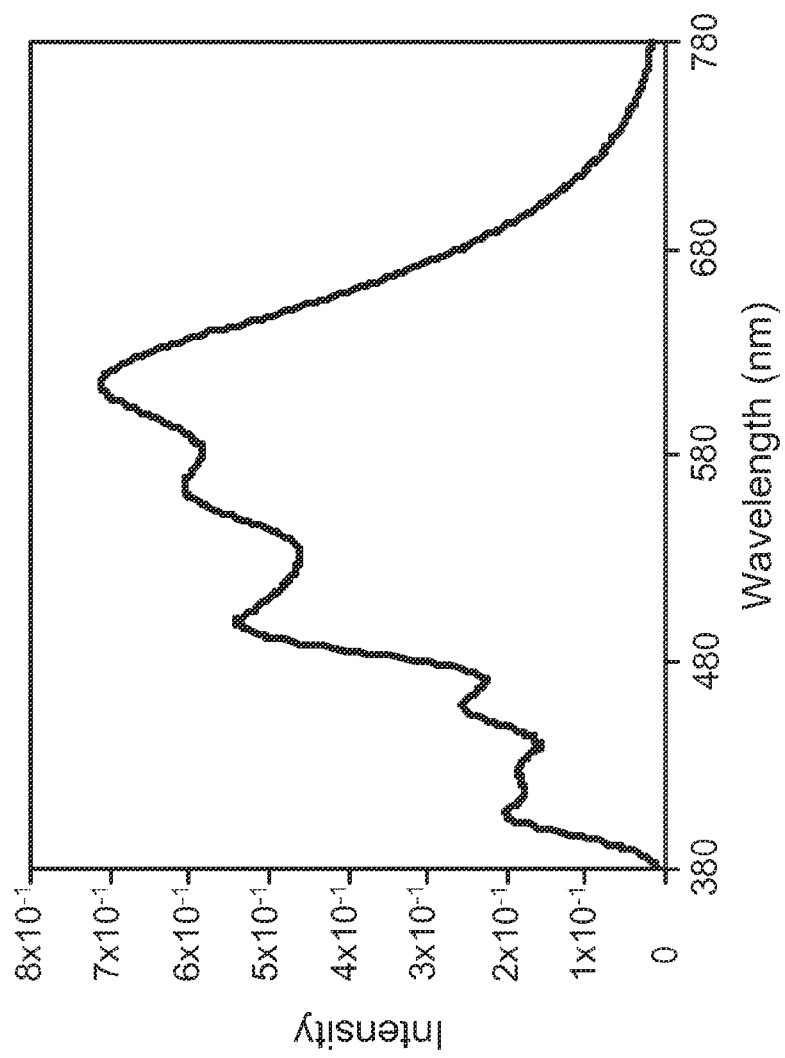
FIG. 5 is a power spectrum of the full-band and high-CRI light emitted by the full-band and high-CRI organic light-emitting diode.
Figure 6:
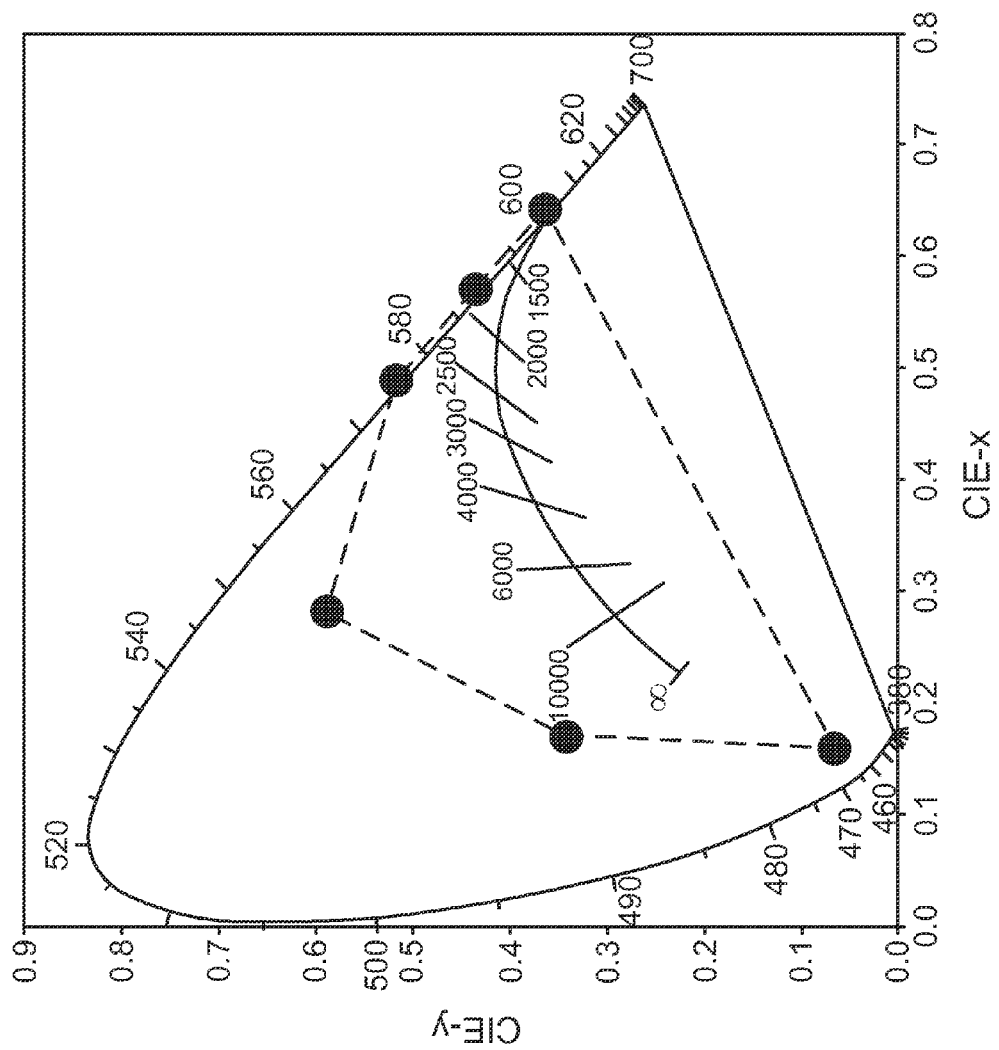
FIG. 6 is a 1931 CIE (Commission International de'Eclairage) chromaticity diagram of the blackbody radiation complementary lights.

Please continuously refer to FIG. 5, there is shown a power spectrum of the full-band and high-CRI light emitted by the full-band and high-CRI organic light-emitting diode. Moreover, please refer to FIG. 6, which illustrates a 1931 CIE (Commission International de'Eclairage) Chromaticity Diagram of the blackbody radiation complementary lights. As shown in FIGS. 4 and 5, the blackbody radiation complementary lights of deep-blue, orange-red, yellow, green, sky-blue, and deep-red mix to each other and then become the full-band and high-CRI light having the CRI (Color Rendering Index) of 92.2 and the CT (Color Temperature) of 3639K.

In addition, the CIE coordinates of the blackbody radiation complementary lights of deep-blue, orange-red, yellow, green, sky-blue, and deep-red are (0.17, 0.07), (0.57, 0.43), (0.49, 0.51), (0.29, 0.58), (0.18, 0.34), and (0.64, 0.36), respectively. In the 1931 CIE chromaticity diagram of FIG. 6, the above-mentioned 6 CIE coordinates surround to a specific area, and the specific area fully encloses the Planck's locus on 1931 CIE chromaticity diagram, wherein the Planck's locus is also called blackbody radiation curve.

Next, a second experimental framework for the full-band and high-CRI organic light-emitting diode 1 of the present invention will be introduced. Please refer to FIG. 7, there is shown a composition material table of the second experimental framework for the full-band and high-CRI organic light-emitting diode. As shown in FIG. 7 and differing from above-mentioned first experimental framework, the weight percentage of the first light-emitting layer 14 is 0.32. In addition, the second light-emitting layer 15 is doped with an orange-red dye, a yellow dye and a green dye, wherein the weight percentages (wt %) of the orange-red dye, the yellow dye and the green dye are 0.24, 0.2 and 0.6, respectively. Moreover, the third light-emitting layer 16 is doped with a sky-blue dye and a deep-red dye, wherein the weight percentages (wt %) of the sky-blue dye and the deep-red dye are 0 and 0.47.

Figure 8:
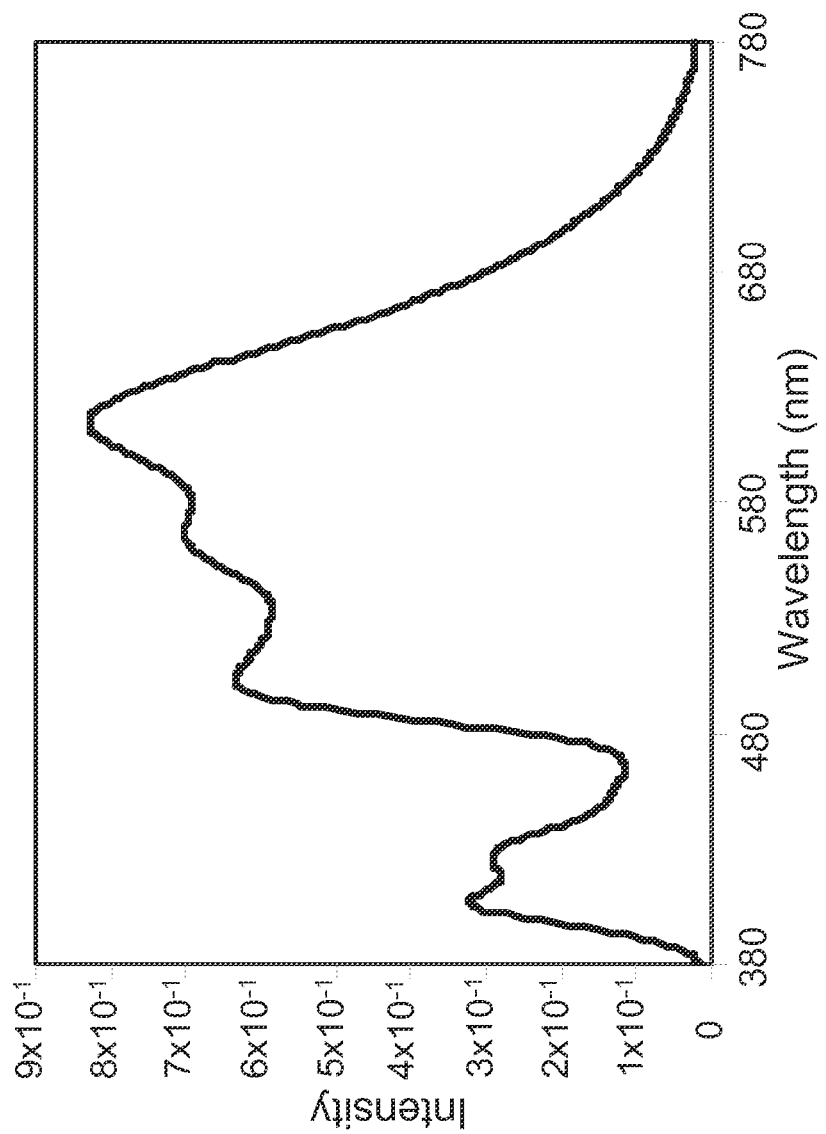
FIG. 8 is a power spectrum of the full-band and high-CRI light emitted by the full-band and high-CRI organic light-emitting diode.
Figure 9:
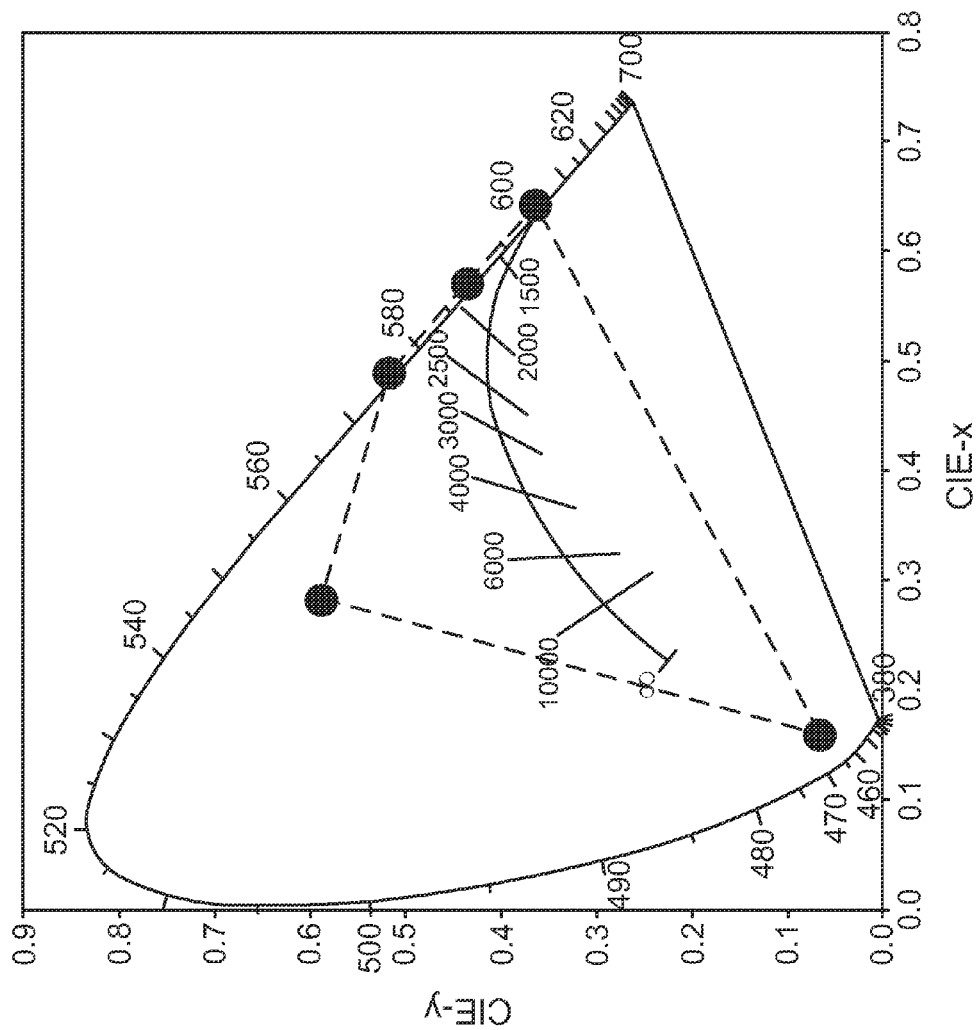
FIG. 9 is a 1931 CIE chromaticity diagram of the blackbody radiation complementary lights.

Please continuously refer to FIG. 8, there is shown a power spectrum of the full-band and high-CRI light emitted by the full-band and high-CRI organic light-emitting diode. Moreover, please refer to FIG. 9, which illustrates a 1931 CIE chromaticity diagram of the blackbody radiation complementary lights. As shown in FIGS. 7 and 8, the blackbody radiation complementary lights of deep-blue, orange-red, yellow, green, and deep-red mix to each other and then become the full-band and high-CRI light having the CRI (Color Rendering Index) of 90.4 and the CT (Color Temperature) of 3546K.

In addition, the CIE coordinates of the blackbody radiation complementary lights of deep-blue, orange-red, yellow, green, and deep-red are (0.17, 0.07), (0.57, 0.43), (0.49, 0.51), (0.29, 0.58), and (0.64, 0.36), respectively. In the 1931 CIE chromaticity diagram of FIG. 6, the above-mentioned 5 CIE coordinates surround to a specific area, and the specific area fully encloses the Planck's locus on 1931 CIE chromaticity diagram.

Thus, through the experiment data of the first and second experimental frameworks, the full-band and high-CRI organic light-emitting diode 1 of the present invention are proven of being actually practicable, and able to emit a full-band and high-CRI light, wherein the full-band and high-CRI light may be a low-CT orange-red light, a high-CT white light, or others color light with different CT. The most important is that, the full-band and high-CRI organic light-emitting diode 1 of the present invention can emit the full-band and high-CRI light as long as the specific area surrounded by the CIE coordinates of the blackbody radiation complementary lights fully encloses the Planck's locus on 1931 CIE chromaticity diagram, wherein, it does not limit the number of the blackbody radiation complementary lights to "6", "5" or "4". Moreover, through the experiment data, it is able to further confirm that the full-band and high-CRI light would be much better if all the blackbody radiation complementary lights reveal a single peak power spectrum.

Figure 10:
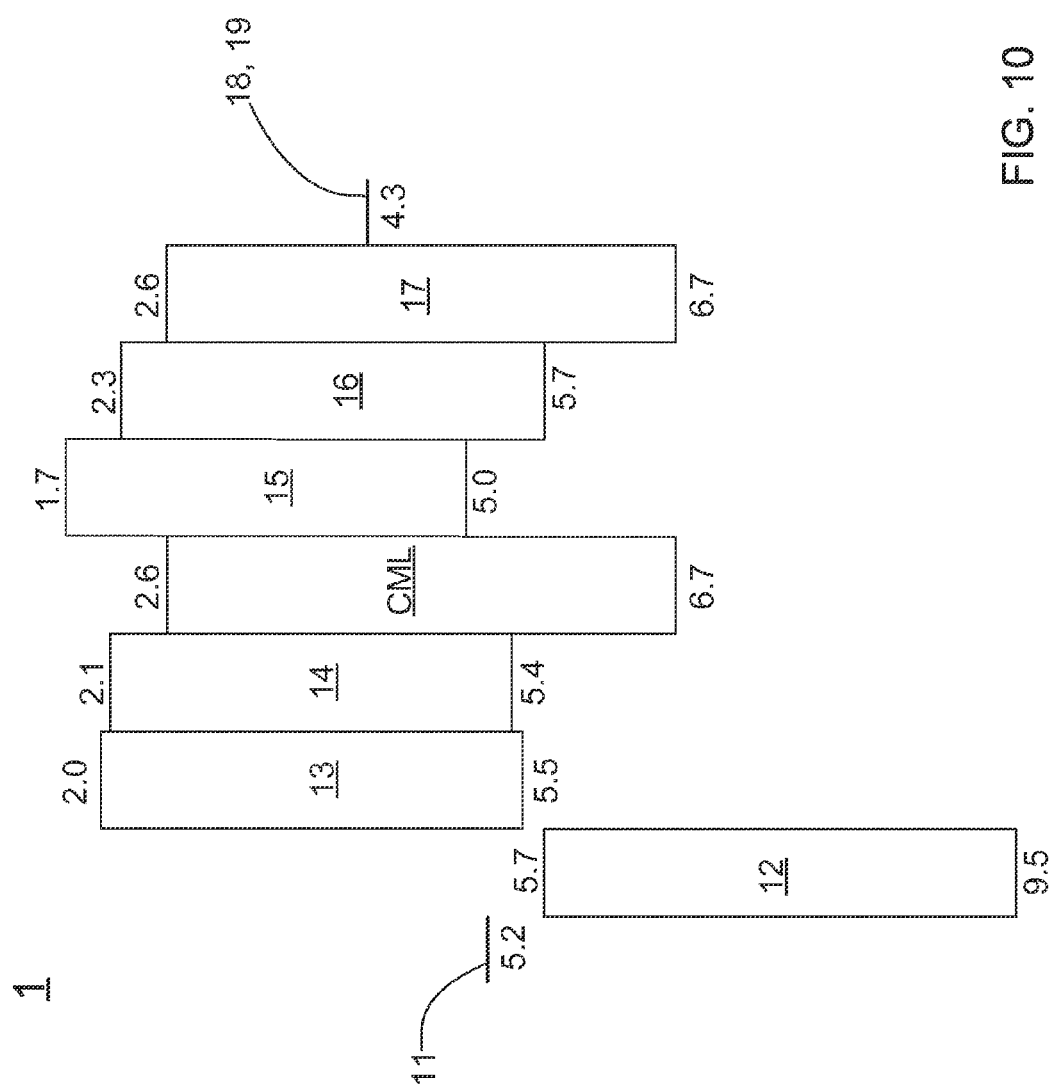
FIG. 10 is an energy band framework of a second embodiment of the full-band and high-CRI organic light-emitting diode according to the present invention.

The full-band and high-CRI organic light-emitting diode 1 of the present invention further includes a second embodiment. Please refer to FIG. 10, which illustrates an energy band framework of a second embodiment of the full-band and high-CRI organic light-emitting diode according to the present invention. As shown in FIG. 10 and differing from above-mentioned first embodiment, the second embodiment of the full-band and high-CRI organic light-emitting diode 1 further includes a carrier modulation layer CML, wherein the carrier modulation layer CML is disposed between the first light-emitting layer 14 and the second light-emitting layer 15, used for modulating the light intensity of the first light-emitting layer 14 and the second light-emitting layer 15. Herein, it needs to particularly explain that, the carrier modulation layer CML does not limit to be disposed between the first light-emitting layer 14 and the second light-emitting layer 15 in the second embodiment, it may be also disposed between the second light-emitting layer 15 and the third light-emitting layer 16 for intensity modulation purpose.

Thus, through the descriptions, the full-band and high-CRI organic light-emitting diode of the present invention has been completely introduced and disclosed; Moreover, the practicability and the technology feature have also been proven by various experiment data. In summary, the present invention has the following advantages:

1. In the present invention, a plurality of dyes are doped in a plurality of light-emitting layers for making the light-emitting layers emit a plurality of blackbody radiation complementary lights, so as to facilitate the blackbody radiation complementary lights mix to each other and then become a full-band and high-CRI light.
2. Inheriting to above point 1, moreover, the CIE coordinates of the blackbody radiation complementary lights surround to a specific area on 1931 CIE chromaticity diagram, and the specific area fully encloses the Planck's locus on 1931 CIE chromaticity diagram, such that the blackbody radiation complementary lights can mix to each other and become the full-band and high-CRI light.
3. Besides, through various experiment data, it is able to confirm that the full-band and high-CRI light would be much better if all the blackbody radiation complementary lights reveal a single peak power spectrum.

The above description is made on embodiments of the present invention. However, the embodiments are not intended to limit scope of the present invention, and all equivalent implementations or alterations within the spirit of the present invention still fall within the scope of the present invention.

What is claimed is:

1. A full-band and high-CRI organic light-emitting diode, comprising:
    a first conductive layer;
    at least one first carrier transition layer, being formed on the first conductive layer;
    a plurality of light-emitting layers, being formed on the first carrier transition layer;
    at least one second carrier transition layer, being formed on the light-emitting layer; and
    a second conductive layer, being formed on the second carrier transition layer;
    wherein a plurality of dyes are doped in the light-emitting layers, so as to make the light-emitting layers emit a plurality of blackbody radiation complementary lights, therefore the blackbody radiation complementary lights mix to each other and then become a full-band and high-CRI light.

2. The full-band and high-CRI organic light-emitting diode of claim 1, wherein the first conductive layer is an anode and the second conductive layer is a cathode.

3. The full-band and high-CRI organic light-emitting diode of claim 1, wherein the blackbody radiation complementary lights comprise: a deep-red light, an orange-red light, a yellow light, a green light, a sky-blue light, and a deep-blue light.

4. The full-band and high-CRI organic light-emitting diode of claim 1, wherein the blackbody radiation complementary lights comprise: a deep-red light, an orange-red light, a yellow light, a green light, and a sky-blue light.

5. The full-band and high-CRI organic light-emitting diode of claim 1, wherein the blackbody radiation complementary lights comprise: a deep-red light, a yellow light, a sky-blue light, and a deep-blue light.

6. The full-band and high-CRI organic light-emitting diode of claim 1, wherein the first carrier transition layer comprises a hole-injecting layer and a hole-transporting layer.

7. The full-band and high-CRI organic light-emitting diode of claim 1, wherein the second carrier transition layer comprises an electron-transporting layer and an electron-injecting layer.

8. The full-band and high-CRI organic light-emitting diode of claim 1, wherein the second carrier transition layer is an electron-transporting layer.

9. The full-band and high-CRI organic light-emitting diode of claim 1, further comprising a carrier modulation layer formed between any two light-emitting layers, used for modulating the intensity of the blackbody radiation complementary lights.

10. The full-band and high-CRI organic light-emitting diode of claim 9, wherein the color temperature of the full-band and high-CRI light is selected from the group consisting of: high color temperature and low color temperature.

* * * * *